(12) United States Patent
Blawat et al.

(10) Patent No.: US 8,320,174 B2
(45) Date of Patent: Nov. 27, 2012

(54) ELECTROMECHANICAL SWITCH, STORAGE DEVICE COMPRISING SUCH AN ELECTROMECHANICAL SWITCH AND METHOD FOR OPERATING THE SAME

(75) Inventors: Meinolf Blawat, Hannover (DE); Herbert Schuetze, Celle (DE); Holger Kropp, Wedemark (DE)

(73) Assignee: Thomson Licensing, Issy les Moulineaux (FR)

( * ) Notice: Subject to any disclaimer, the term of this patent is extended or adjusted under 35 U.S.C. 154(b) by 176 days.

(21) Appl. No.: 12/931,812

(22) Filed: Feb. 11, 2011

(65) Prior Publication Data
US 2011/0216584 A1    Sep. 8, 2011

(30) Foreign Application Priority Data

Mar. 4, 2010    (EP) .................................... 10305219

(51) Int. Cl.
*G11C 11/50* (2006.01)
(52) U.S. Cl. ....................................... 365/164; 365/166
(58) Field of Classification Search .................. 365/164, 365/166
See application file for complete search history.

(56) References Cited

U.S. PATENT DOCUMENTS

| | | | |
|---|---|---|---|
| 7,289,357 B2 * | 10/2007 | Bertin et al. .................. | 365/164 |
| 7,394,687 B2 * | 7/2008 | Bertin et al. .................. | 365/164 |
| 7,402,770 B2 * | 7/2008 | Sun et al. ...................... | 365/164 |
| 7,558,103 B2 * | 7/2009 | Nakamura et al. ............ | 365/164 |
| 7,649,769 B2 * | 1/2010 | Bertin et al. .................. | 365/164 |
| 7,663,911 B2 * | 2/2010 | Bertin et al. .................. | 365/164 |
| 7,911,831 B2 * | 3/2011 | Rueckes et al. ............... | 365/164 |
| 7,940,557 B1 * | 5/2011 | Trossen et al. ................ | 365/164 |
| 7,986,546 B2 * | 7/2011 | Bertin et al. .................. | 365/164 |
| 8,031,514 B2 * | 10/2011 | Somu et al. .................... | 365/164 |
| 2002/0153583 A1 | 10/2002 | Frazier et al. | |
| 2003/0155221 A1 | 8/2003 | Kawai | |
| 2004/0142583 A1 | 7/2004 | Mathieu et al. | |
| 2006/0139842 A1 | 6/2006 | Shim et al. | |
| 2008/0233744 A1 | 9/2008 | Kaul et al. | |

FOREIGN PATENT DOCUMENTS

WO    WO03078305    9/2003

OTHER PUBLICATIONS

See Search Report Aug. 19, 2010.

\* cited by examiner

*Primary Examiner* — Trong Phan
(74) *Attorney, Agent, or Firm* — International IP Law Group, PLLC

(57) ABSTRACT

An electromechanical switch is described, which comprises a conductive body and a plurality of carbon nanotubes being separate to each other, each of the carbon nanotubes being connected to at least one common terminal electrode with at least one of its ends, wherein in an open state of the switch each of the carbon nanotubes substantially projects along a surface of the conductive body and keeps up a gap to said surface, and wherein in a closed state of the switch at least one carbon nanotube is bend in a direction of the surface to close an electrical contact between said terminal electrode and the conductive body. The size of the gap between the respective carbon nanotube and the surface is different for each one of the plurality of carbon nanotubes.

13 Claims, 5 Drawing Sheets

ELECTROMECHANICAL SWITCH, STORAGE DEVICE COMPRISING SUCH AN ELECTROMECHANICAL SWITCH AND METHOD FOR OPERATING THE SAME

This application claims the benefit, under 35 U.S.C. §119 of EP patent application Ser. No. 10305219.7, filed 04 Mar. 2010.

In recent years an alternative concept for a non-volatile solid state random access memory based on carbon nanotubes has been published. A storage cell has been presented that is based on a micromechanical switch using a bendable carbon nanotube. The carbon nanotube bridges a trench between two electrodes that are deposited on an electrically conductive substrate. The two ends of the carbon nanotube are in electrical contact with the two electrodes. The working principle is as follows: Using a sufficiently large current the carbon nanotube bridging the two electrodes is being heated up so that it bends towards the substrate. Once in contact with the substrate, Van der Waal forces will keep the carbon nanotube at its position. Due to the fact that the carbon nanotube is now in electrical contact with the substrate, the resistance between the two electrodes and the substrate is relatively small. A suitable current allows to detect the bent carbon nanotube, thus binary information is stored in such a storage cell. The aforementioned concept for a non-volatile solid state random access memory based on carbon nanotubes is known, for example, from http://www.nantero.com.

A further concept for a microelectromechanical switch is known from US 2008/0233744 A1. According to this concept a carbon nanotube is fixed to a terminal electrode. A voltage is applied between a substrate and the terminal electrode, causing an opposite electric charge to be induced between the carbon nanotube and the substrate. Electrostatic forces that result from the oppositely charged substrate and carbon nanotube cause the latter to bend towards the substrate.

Though known microelectromechanical switches offer great advantages with respect to the design of a non-volatile solid state random access memory, e.g. fast reading and high retention of bit information, there is still a need for an improved capacity of such storage devices.

Accordingly, it is an object of the present invention to provide an electromechanical switch that allows the construction of a storage device having an increased storage capacity. It is a further object of the present invention to provide a storage device comprising such an electromechanical switch and a method for operating the same.

These objects are solved by the subject matter of the independent claims. Advantageous embodiments are subject matter of the dependent claims.

According to the invention, an electromechanical switch comprises a conductive body and a plurality of separate carbon nanotubes. The conductive body is a substrate or any other basis suitable for growing the respective structures on its surface. Each of the carbon nanotubes is connected to at least one common terminal electrode with one of its ends. In an open state of the electromechanical switch, each one of the carbon nanotubes substantially projects along a surface of the conductive body and keeps up a gap to said surface. In a closed state of the electromechanical switch, at least one carbon nanotube is bent in a direction of a surface to close an electrical contact between said terminal electrode and the conductive body. The direct electrical contact takes place between the respective carbon nanotube and the electrically conductive body, i.e. the aforementioned electrical contact between the terminal electrode and the conductive body takes place via the carbon nanotube. For each one of the plurality of carbon nanotubes, a size of the gap between the respective carbon nanotube and the surface of the conductive body is different.

The construction of the electromechanical switch according to the invention is based on the following considerations. Carbon nanotube storage cells based on microelectromechanical switches known from prior art suffer from the drawback that only one bit of information is stored per storage cell. To tackle this problem the invention suggests a multilevel electromechanical switch. Based on this switch, a storage cell for storing a plurality of bits is designed. Nevertheless, the electromechanical switch is only slightly more complex than its conventional one bit counterparts. This is due to the concept that for each one of the plurality of carbon nanotubes the gap between the respective carbon nanotube and the surface of the conductive body is different. In other words, each carbon nanotube is spaced apart from the conductive body/substrate by a different distance.

The carbon nanotubes may be bent towards the conductive body by heating up the carbon nanotube in question or by applying a force, e.g. an electrostatic force. Independent of the mechanism for bending the carbon nanotube towards the surface of the conductive body, each carbon nanotube is bendable almost individually by applying the same measure, i.e. a heating current, electrostatic force, etc. The only difference is the magnitude of the applied measure, i.e. the magnitude of the heating current or the electrostatic force, etc. The higher e.g. the heating current the higher is the deflection of the carbon nanotubes. As a result, first a carbon nanotube located next to the surface of the conductive body gets into contact with said surface. The carbon nanotubes having a larger distance from the surface will follow with increasing heating current. The same applies for an electromechanical switch having carbon nanotubes that are bendable by an electrostatic field. Consequently, the different switching states of the electromechanical switch are controlled by a single parameter, i.e. the heating current, the electrostatic filed, etc. Advantageously, the electromechanical switch according to the invention offers not only one but a plurality of switching states. The different electrical contacts between the respective carbon nanotubes and the surface of the conductive body can be opened and closed using just one parameter, e.g. a voltage of different magnitude. Therefore, an electromechanical switch according to the invention is perfectly suited for a non-volatile storage cell.

A further electromechanical switch comprises carbon nanotubes that are oriented substantially parallel to each other and further substantially project in a common plane. Preferably, the size of the gap that is present between a respective carbon nanotube and the surface of the body increases from one carbon nanotube to the neighboring one. Due to the parallel alignment of the carbon nanotubes a production process is very economic.

It is further advantageous if the carbon nanotubes are bendable by electrostatic forces applied to the carbon nanotubes by an electrostatic field that is generated by a top and a bottom electrode. The electrically conductive body acts as the bottom electrode, whereas the top electrode projects in a plane substantially parallel to the common plane of the plurality of carbon nanotubes. The electrostatic forces that are applied to the carbon nanotubes depend on the size of the gap between the top and the bottom electrode when a defined constant voltage is applied to the top and bottom electrode. The magnitude of an electrostatic field that is present between the two electrodes differs for each one of the carbon nanotubes due to the fact that the distance between the top and bottom electrode is different for each carbon nanotube. By simply increasing the applied voltage one or more carbon nanotubes are bent towards the surface of the conductive body and close the respective electrical contact.

A further advantageous electromechanical switch comprises a conductive body having a surface facing the plurality of carbon nanotubes, wherein this surface is staggered. A staggered structure can be easily etched into the material of the body, therefore allowing a very economic production process. Preferably, the staggered surface has as many steps as separate carbon nanotubes are included in the switch and each one of the plurality of carbon nanotubes is assigned to one step of the staggered surface.

A further advantageous electromechanical switch has a first and a second terminal electrode that are present on the surface of the electrically conductive body. The terminal electrodes are electrically insulated from said body and define a grove between each other. The carbon nanotubes are fixed to the first and second terminal electrode with their ends. It is further advantageous if the carbon nanotubes are bendable by an electrical current flowing through the carbon nanotube from the first terminal electrode to the second terminal electrode.

Advantageously, a storage device comprises at least one electromechanical switch according to the invention. Bit information is stored in the storage device in the form of an open/closed state of the electromechanical switch.

Advantageously, the storage device, e.g. a storage cell, can store multiple bits of information using just a single electromechanical switch. Said switch is, for example, connected to a drive voltage. By simply increasing the drive voltage, one carbon nanotube after the other is bent towards the surface of the electrically conductive body. Upon coming into contact with the surface of the conductive body, the respective carbon nanotube remains in the contact position due to the fact that the carbon nanotube is caught by Van der Waal forces. Consequently, a non volatile storage device is provided that has an increased storage capacity. For erasing the respective bit of information, the drive voltage is given the opposite polarization. When the resulting electric field is strong enough the Van der Waal link between the respective carbon nanotube and the conductive body is overcome.

Preferably, the number of storable bits corresponds to the number of separate carbon nanotubes included in the electromechanical switch. Each bit of information corresponds to an open/closed state of an electrical contact between the respective carbon nanotube and the electrically conductive body.

Bit information is stored using a single or a plurality of carbon nanotubes per step, i.e. a single or a bundle of carbon nanotube are bent to one step of the staggered surface of the electrically conductive body in order to store one bit of information. In other words, each step of the staggered surface of the electrically conductive body can face a single carbon nanotube or a plurality of corresponding carbon nanotubes.

A method for operating a storage device according to the invention comprises the following steps. For writing a first and a second bit, a first voltage for generation of an electrostatic field having a first strength is applied. Said electrostatic field causes a first carbon nanotube to bend and close an electric contact to the electrically conductive body to write a first bit. A second voltage for generation of an electrostatic field having a second strength is applied to the electromechanical switch to write a second bit. Preferably, the second voltage is higher than the first voltage. Advantageously, bit information is stored in the respective storage device by simply increasing or decreasing the drive voltage.

For a better understanding the invention shall now be explained in more detail in the following description with reference to the figures. It is understood that the invention is not limited to this exemplary embodiment and that specified features can also expediently be combined and/or modified without departing from the scope of the present invention as defined in the appended claims. In the figures:

Figure 1:
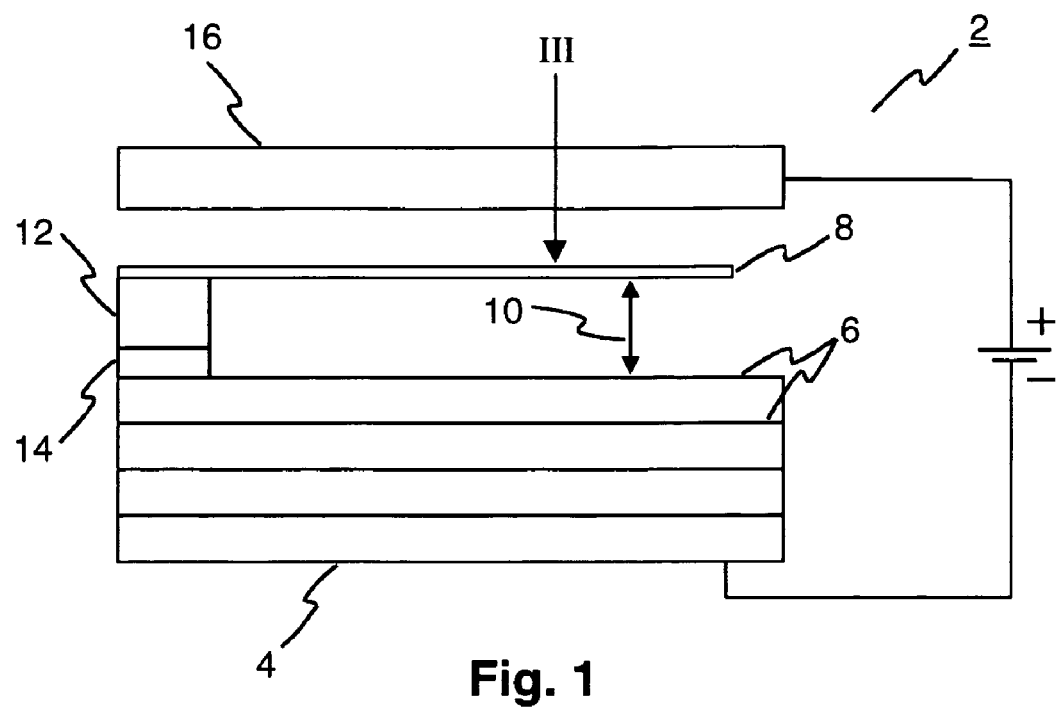
FIG. 1 shows a side view of an electromechanical switch in an open state.
Figure 2:
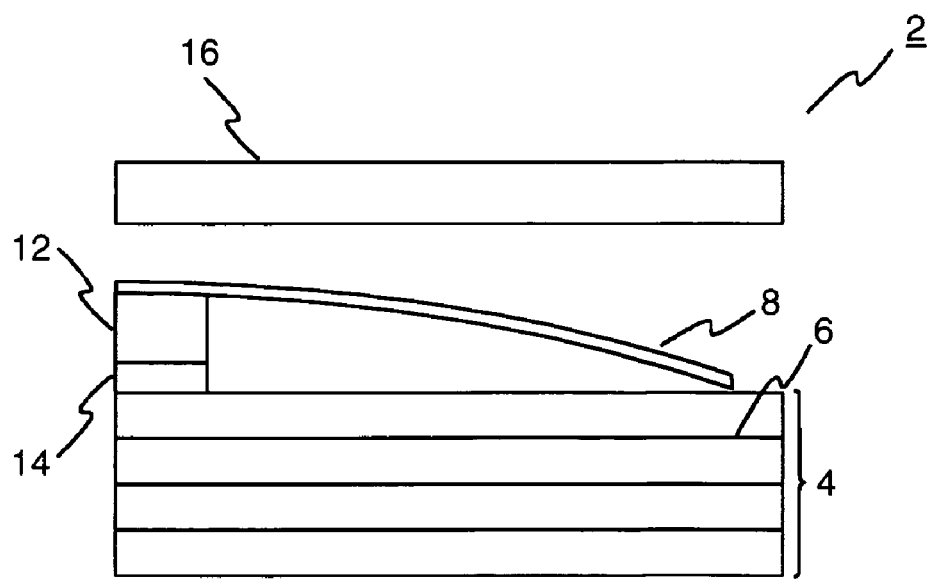
FIG. 2 shows the electromechanical switch of FIG. 1 in a closed state.
Figure 3:
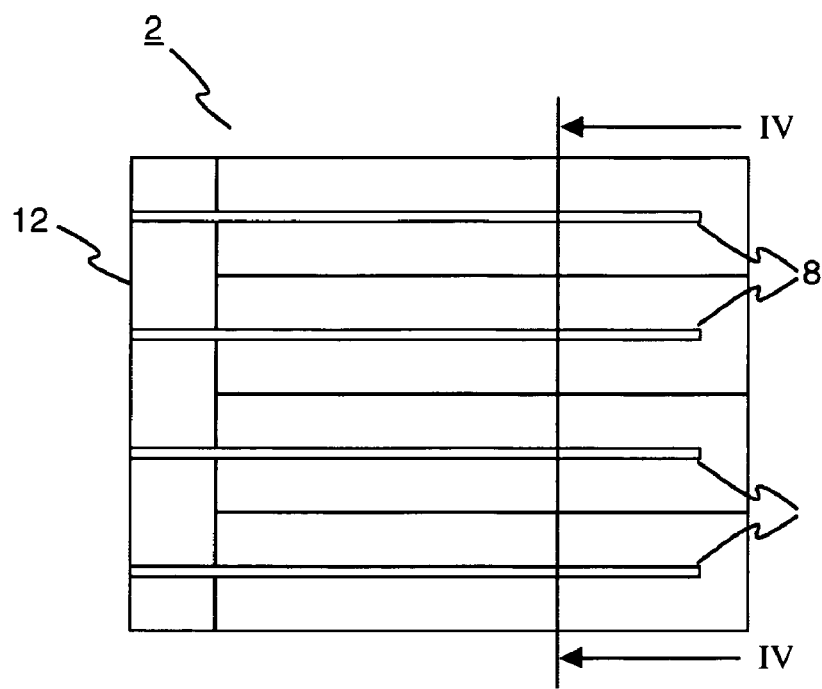
Figure 4:
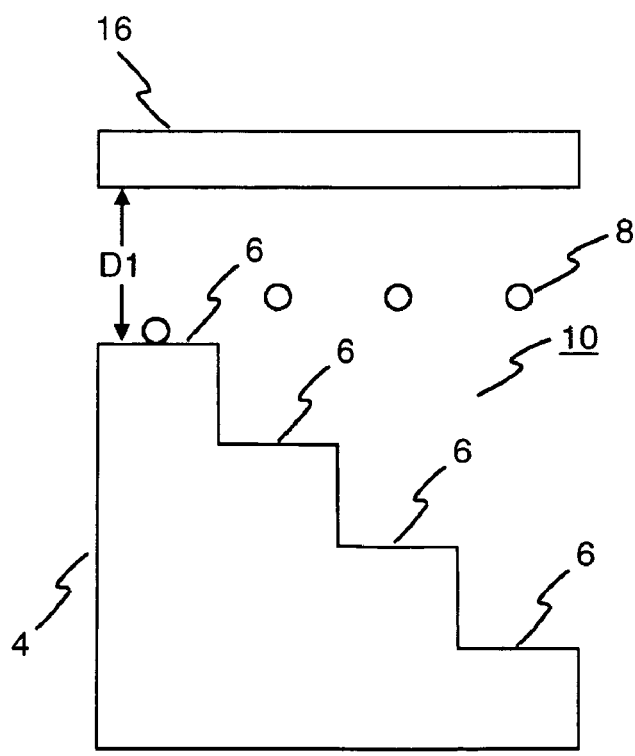
Figure 5:
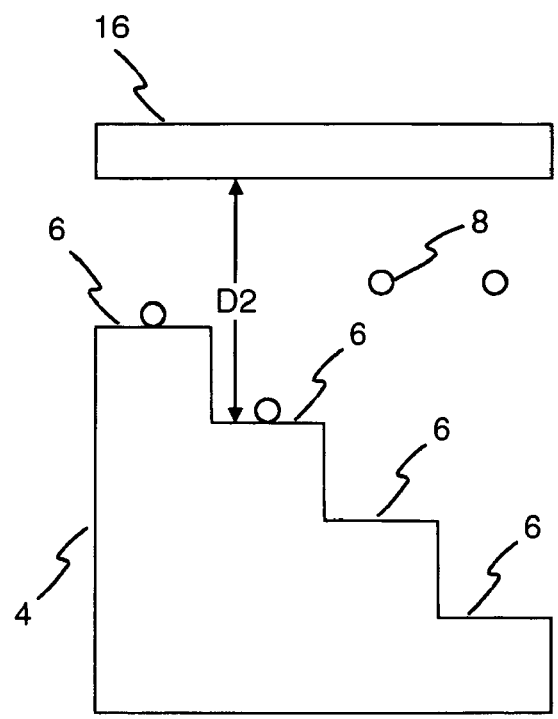
Figure 6:
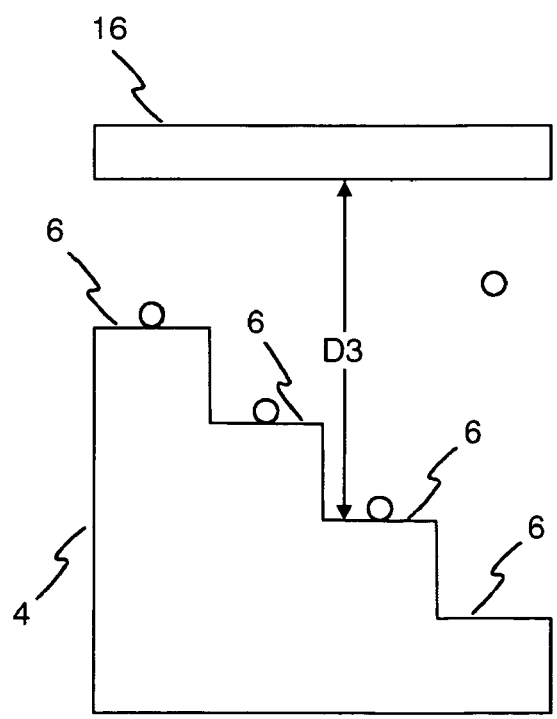
Figure 7:
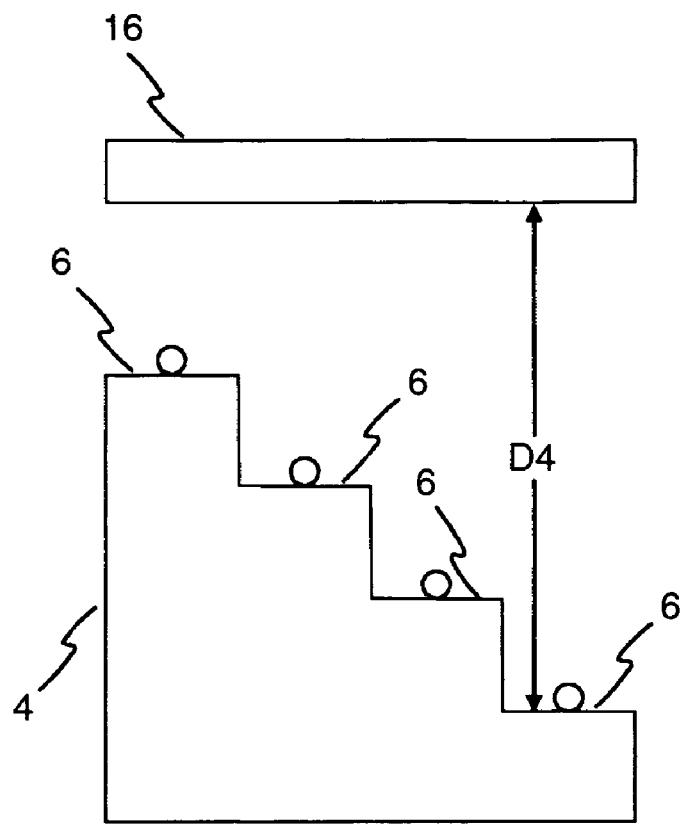
Figure 8:
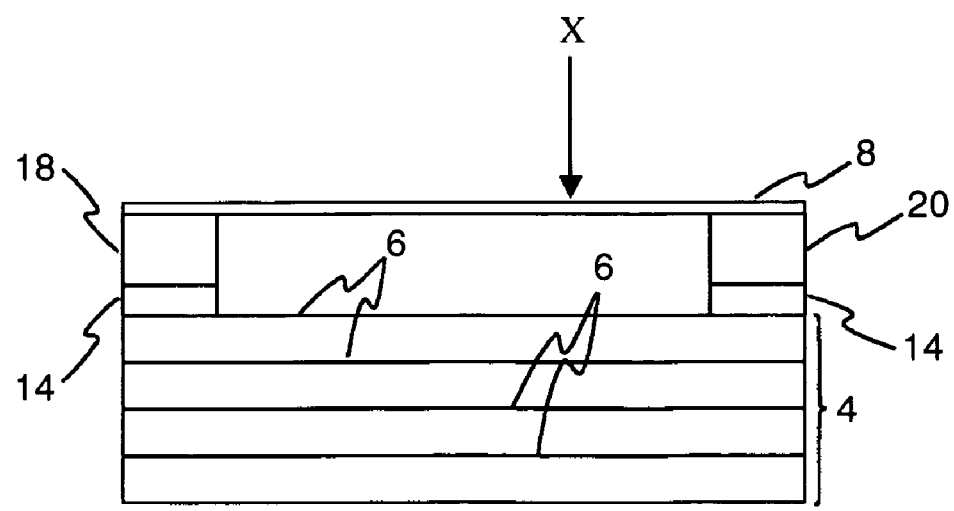
Figure 9:
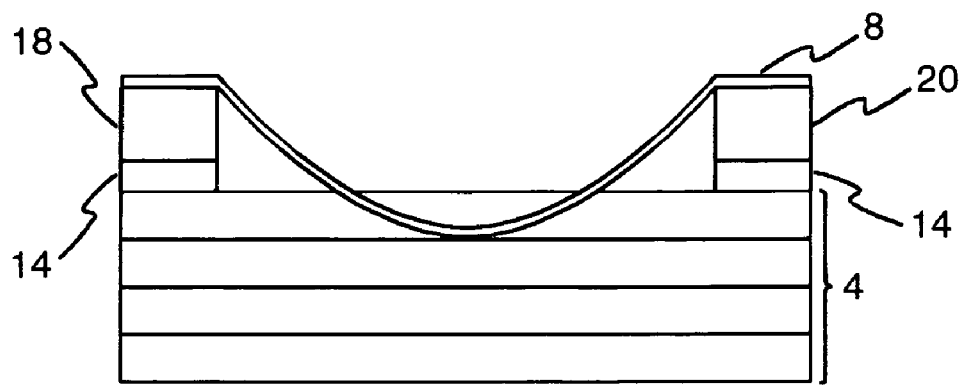
Figure 10:
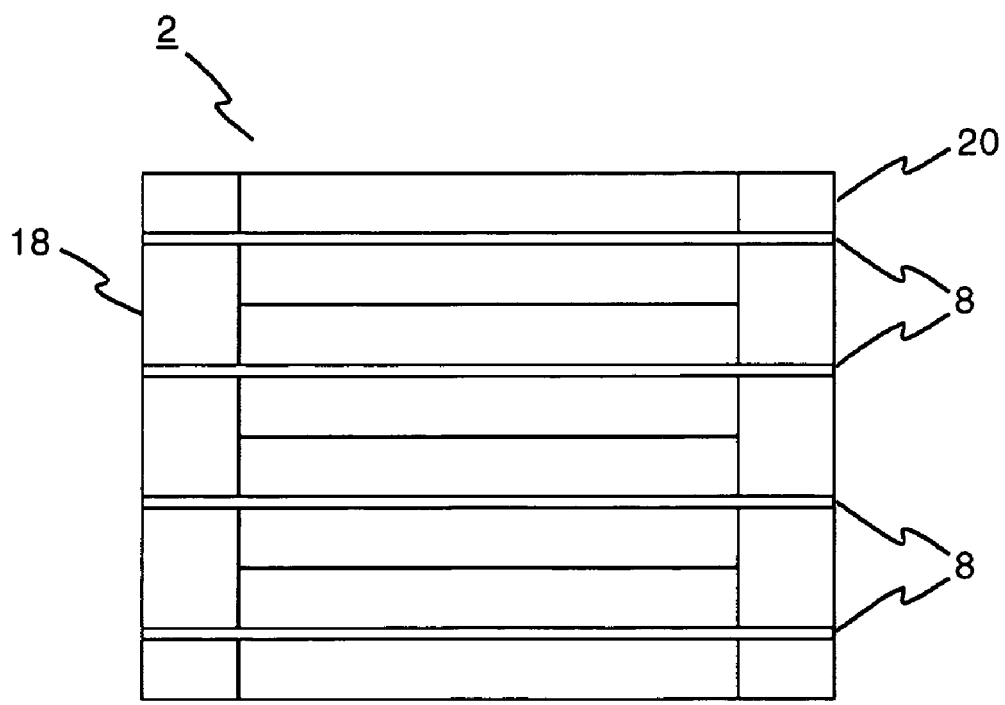

FIG. 3 shows a top view of the electromechanical switch of FIGS. 1 and 2, FIG. 4 shows a cross sectional view of the electromechanical switch in a first switching position, FIG. 5 shows the electromechanical switch in a second switching position, FIG. 6 shows the electromechanical switch in a third switching position, FIG. 7 shows the electromechanical switch in a fourth switching position, FIG. 8 shows a side view of a further electromechanical switch in an open state, FIG. 9 shows the electromechanical switch of FIG. 8 in a closed state, and FIG. 10 shows a top view of the electromechanical switch of FIGS. 8 and 9.

FIG. 1 shows an electromechanical switch 2 in an open state, whereas FIG. 2 shows the respective switch 2 in its closed state. Both figures show a side view. The switch 2 comprises a substrate 4 as a conductive body, e.g. a silicon substrate, said substrate 4 having a staggered surface 6. Four carbon nanotubes 8 are located opposite to the staggered surface 6. For the sake of clarity, only a single carbon nanotube 8 is depicted in FIGS. 1 and 2. The carbon nanotubes 8 substantially project along the staggered surface 6, keeping up a gap 10 in case the electromechanical switch 2 is in an open state. Each carbon nanotube 8 is connected to a terminal electrode 12 with one of its ends. The terminal electrode 12 is electrically insulated from the substrate 4 by an insulation layer 14.

The carbon nanotubes 8 are bent towards the surface 6 of the substrate 4 by electrostatic forces. These electrostatic forces are generated by a drive voltage that is applied between a top electrode 16 and the substrate 4, which acts as a bottom electrode.

FIG. 2 shows the electromechanical switch 2 in a closed state. The power source depicted in FIG. 1 has been omitted for the sake of clarity. The carbon nanotube 8 is bent towards the surface 6 of the first and uppermost step of the staggered substrate 4. It is captured on said surface 6 by Van der Waal forces. Consequently, an electrical contact between the terminal electrode 12 and the substrate 4 is closed via the carbon nanotube 8.

FIG. 3 shows a top view of the electromechanical switch 2 of FIGS. 1 and 2 in a viewing direction indicated by the arrow "III" in FIG. 1. The switch 2 comprises four carbon nanotubes 8 that project in a substantially common plane and are oriented substantially parallel to each other. The carbon nanotubes 8 are connected to the common terminal electrode 12, i.e. all carbon nanotubes 8 are electrically wired together by said terminal electrode 12. Each carbon nanotube 8 is adapted to provide an electric contact between said terminal electrode 12 and the substrate 4. For switching the respective carbon nanotubes 8, specified voltages are applied between the substrate 4 and the top electrode 16. This will be explained below with reference to FIGS. 4 to 7, which show a cross sectional view of the electromechanical switch 2 along the line indicated by the arrows "IV" in FIG. 3.

There is a gap present between the top electrode 16 and the staggered surface 6 of the substrate 4. The size of said gap varies from step to step. It starts at a first distance D1 between the first and uppermost step of the substrate 4 and the top electrode 16 down to a fourth distance D4 between the surface 6 of the lowest step of the staggered substrate 4 and the top electrode 16.

Due to the fact that the distance D1 to D4 is different for each step of the staggered surface 6, the electrostatic field that is applied to the respective carbon nanotube 8 located in the respective gap is different for each one of the plurality of carbon nanotubes 8. The first carbon nanotube 8, which is located in the gap having the distance D1, experiences the largest electrostatic field. The carbon nanotube 8, which is located in the gap having the size D4, experiences the smallest electrostatic field, as said electrostatic field decreases with increasing distance D1 to D4 between the substrate 4 and the top electrode 16.

Accordingly, the carbon nanotube 8, which is located in the gap having the distance D1, is bent to the surface 6 of substrate 4 when the voltage exceeds a first specified threshold. The second carbon nanotube 8, which is located in the gap having a distance D2, follows when the strength of the electrostatic field in the gap having the distance D2 reaches a comparable value. As has been explained before, the drive voltage that is necessary to generate an adequate field in the gap 10 having a distance D2 is higher. In the same way, i.e. by increasing the drive voltage, the further carbon nanotubes 8 being located at D3 and D4 follow.

The electrical resistance between the terminal electrode 12 and the substrate 4 decreases for each carbon nanotube 8 in contact with the surface 6 of the substrate 4, ideally by half of its value. Accordingly, the switching state of the electromechanical switch 2 may be obtained by determining this value.

FIGS. 8 and 9 show a further embodiment of an electromechanical switch 2 according to the invention. For the sake of clarity FIGS. 8 and 9 again show only one carbon nanotube 8. The respective carbon nanotubes 8 are connected to a first and a second terminal electrode 18,20 with their ends. The first and second terminal electrodes 18,20 are electrically insulated from the substrate 4 by an insulation layer 14. The substrate 4 offers a staggered surface 6 as it has been described with respect to FIGS. 1 to 7. The carbon nanotubes 8 are bent towards the surface 6 of the substrate 4 by applying an electric current to the carbon nanotubes 8, said current flowing through the carbon nanotubes 8 from the first to the second terminal electrode 18,20. Due to this measure, the carbon nanotubes 8 are heated up and are bent into the grove between the first and second terminal electrode 18,20. This is depicted in FIG. 9. By way of example, the carbon nanotube 8 shown in FIG. 9 is in contact with the second step of the staggered surface 6, thereby providing an electric contact between the substrate 4 and the first and second terminal electrodes 18,20, respectively. As it has been explained with respect to FIGS. 1 to 7, the electrical resistance between the first and second terminal electrodes 18,20, respectively, and the substrate 4 decreases with the number of carbon nanotubes 8 being in electric contact with the staggered surface 6. Consequently, the switching state of the electromechanical switch 2 can be obtained by reading out this parameter.

FIG. 10 shows a top view of the electromechanical switch 2 of FIGS. 8 and 9 in a viewing direction indicated by the arrow "X" in FIG. 8. Four carbon nanotubes 8 are included in said switch 2, all of them are connected to a common first and second terminal electrode 18,20, respectively.

The electromechanical switches 2 shown in FIGS. 1 to 10 are perfectly suited for a non volatile storage device, wherein the number of storable bits correspond to the number of separate carbon nanotubes 8 that are included in the respective switch 2. Of course, more than one carbon nanotube 8 may be assigned to a single step of the staggered surface 6. Accordingly, bit information is stored by bending one or a plurality of carbon nanotubes 8 down to the respective step of the staggered surface 6.

Also, in FIGS. 1 to 7 an electrostatic field is applied to the carbon nanotubes 8 by the top electrode 16 and the substrate 4 acting as a bottom electrode. As an alternative, the carbon nanotubes 8 are bent due to a current flowing through them, as it is depicted in FIGS. 8 to 10. As a further option, the drive voltage is applied between the carbon nanotubes 8 themselves and the substrate 4, thereby inducing oppositely poled charge carriers in the carbon nanotubes 8 and the substrate 4, respectively. This causes the carbon nanotubes 8 to bend towards the surface 6 of the substrate 4. Consequently, the top electrode 16 may be omitted.

The invention claimed is:

1. Electromechanical switch, comprising a conductive body and a plurality of separate carbon nanotubes, wherein:
    a) each of the carbon nanotubes is connected to at least one common terminal electrode with at least one of its ends,
    b) in an open state of the switch, each of the carbon nanotubes substantially projects along a surface of the conductive body and keeps up a gap to said surface,
    c) in a closed state of the switch, at least one carbon nanotube is bend in a direction of the surface to close an electrical contact between said terminal electrode and the conductive body, and
    d) for each one of the plurality of carbon nanotubes, the size of the gap between the respective carbon nanotube and the surface is different.

2. Electromechanical switch according to claim 1, wherein the carbon nanotubes are oriented substantially parallel to each other and substantially project in a common plane.

3. Electromechanical switch according to claim 2, wherein the carbon nanotubes are bendable by electrostatic forces applied to the carbon nanotubes by an electrostatic field generated by a top and a bottom electrode, wherein the conductive body acts as the bottom electrode and the top electrode projects in a plane being substantially parallel to the common plane of the plurality of carbon nanotubes.

4. Electromechanical switch according to claim 1, wherein the surface of the conductive body, that is facing the plurality of carbon nanotubes, is staggered.

5. Electromechanical switch according to claim 4, wherein the staggered surface has as many steps as separate carbon nanotubes are comprised by the switch, and each one of the plurality of carbon nanotubes is assigned to one step of the staggered surface.

6. Electromechanical switch according to claim 1, wherein a first and a second terminal electrode are present on the surface of the conductive body for each carbon nanotube, the terminal electrodes being electrically insulated to said body and defining a grove between each other, and wherein the carbon nanotubes are fixed to the first and second terminal electrode with one of its ends, respectively.

7. Electromechanical switch according to claim 6, wherein the carbon nanotubes are bendable by an electric current flowing through the carbon nanotube from the first terminal electrode to the second terminal electrode.

8. Storage device comprising at least one electromechanical switch according to claim 1, wherein bit information is storable in the form of an open/closed state of the electromechanical switch.

9. Storage device according to claim 8, wherein a plurality of bits is storable using a single electromechanical switch.

10. Storage device according to claim 9, wherein the number of storable bits corresponds to the number of separate carbon nanotubes included in the electromechanical switch, and each bit information corresponds to an open/closed state of an electrical contact between the respective carbon nanotube and the conductive body.

11. Method for operating a storage device according to claim 8, wherein for writing a first and a second bit, a first voltage for generation of an electrostatic field having a first strength is applied to the electromechanical switch to write a first bit, said electrostatic field causing a first carbon nanotube to bend and to close an electric contact to the conductive body, and subsequently a second voltage for generation of an electrostatic field having a second strength is applied to the electromechanical switch to write a second bit.

12. Method for operating a storage device according to claim 11, wherein the second voltage is higher than the first voltage.

13. Method for operating a storage device according to claim 12, wherein a difference between the first and second voltage corresponds to a difference in size of the gap between the respective carbon nanotubes used for writing said first and second bit and the surface of the conductive body.

* * * * *